United States Patent
Bierdeman et al.

(10) Patent No.: US 9,955,255 B2
(45) Date of Patent: Apr. 24, 2018

(54) AUDIO CLOCKING APPARATUS, SYSTEM, AND METHOD

(71) Applicant: BLACK LION AUDIO, INC., Chicago, IL (US)

(72) Inventors: Nathaniel T. Bierdeman, Chicago, IL (US); Jesus Ortiz, Chicago, IL (US)

(73) Assignee: Black Lion Audio Chicago, Inc., Chicago, IL (US)

( * ) Notice: Subject to any disclaimer, the term of this patent is extended or adjusted under 35 U.S.C. 154(b) by 133 days.

(21) Appl. No.: 15/186,068

(22) Filed: Jun. 17, 2016

(65) Prior Publication Data

US 2016/0373857 A1 Dec. 22, 2016

Related U.S. Application Data

(60) Provisional application No. 62/182,175, filed on Jun. 19, 2015.

(51) Int. Cl.
| | |
|---|---|
| *H03B 5/32* | (2006.01) |
| *H04R 3/00* | (2006.01) |
| *H04R 3/04* | (2006.01) |
| *H03B 1/04* | (2006.01) |

(52) U.S. Cl.
CPC ............. *H04R 3/007* (2013.01); *H03B 1/04* (2013.01); *H03B 5/32* (2013.01); *H04R 3/04* (2013.01); *H03B 2200/009* (2013.01)

(58) Field of Classification Search
CPC ...... H03B 1/04; H03B 5/32; H03B 2200/009; H04R 3/04; H04R 3/007; H04B 15/00
USPC ...... 455/255, 258, 502; 331/1 A, 74, 16, 46, 331/158; 381/94.1
See application file for complete search history.

(56) References Cited

U.S. PATENT DOCUMENTS

| | | | | |
|---|---|---|---|---|
| 5,063,359 | A * | 11/1991 | Leonowich | H03B 5/364 331/108 C |
| 7,652,516 | B2 * | 1/2010 | Bourstein | G06F 1/08 327/291 |
| 8,908,798 | B2 * | 12/2014 | Wilson | H03F 3/38 375/295 |
| 2007/0075793 | A1 * | 4/2007 | Maxim | H03L 7/0895 331/74 |

* cited by examiner

*Primary Examiner* — Arnold Kinkead
(74) *Attorney, Agent, or Firm* — Fox Rothschild LLP; Christopher L. E. Hines

(57) ABSTRACT

Aspects of the present disclosure involve an audio clocking device including high-frequency crystal oscillators capable of consistent low jitter and phase noise. The audio clocking device ensures that any low-jitter and low-noise signals are maintained as the signal propagates through circuitry of the audio clocking device.

12 Claims, 3 Drawing Sheets

United States Patent US 9,955,255 B2

AUDIO CLOCKING APPARATUS, SYSTEM, AND METHOD

CROSS REFERENCE TO RELATED APPLICATIONS

The present non-provisional utility application claims priority under 35 U.S.C. § 119(e) to co-pending provisional application No. 62/182,175 entitled "Audio Clocking Apparatus, System, And Method," filed on Jun. 19, 2015, and which is hereby incorporated by reference herein.

TECHNICAL FIELD

Aspects of the present disclosure relate to audio clocking devices and/or apparatuses, and in particular, to an audio clocking apparatus including high-frequency crystal oscillators capable of consistent low jitter and phase noise.

BACKGROUND

Processing audio signals with digital audio devices generally requires the digitization of analog sound sources. Accordingly, analog audio signals are typically converted from an analog signal format to a digital signal format that stores the sounds of the audio as binary data. To digitize the analog signal, typically a process called sampling is performed that quantizes the analog audio signal at certain intervals and according to a certain frequency. The precision of the conversion is dependent on the quality, stability, and consistency of the internal clock circuitry included in whatever digital audio device is used to perform the sampling.

Crystal oscillators have been employed in many audio devices to convert analog signals to digital signals and vice versa because crystal oscillators produce highly accurate oscillation with low jitter and low noise. Although crystal oscillators have outstanding low noise and low jitter characteristics, typical use of crystal oscillators may not eliminate noise completely.

It is with these concepts in mind, among others, that various aspects of the present disclosure were conceived.

SUMMARY

Aspects of the present disclosure involve apparatuses, systems, and methods for digital audio clocking. The apparatuses, systems, and methods include an oscillation circuit for propagating a low jitter output through other circuitry of the digital audio clocking device, wherein the oscillation circuit comprises at least one high-frequency crystal oscillator to generate the low jitter output, wherein the other circuitry comprises: a component to isolate electrical power provided to the oscillation circuit from at least one component included in the other circuitry to protect the low jitter output from at least one parasitic element; and a first buffering circuit to first buffer a portion of the low jitter output to maintain low jitter of the output and maintain signal isolation. The apparatuses, systems, and methods further include a transformer to receive the portion of the low jitter output from the buffering circuit to maintain the signal isolation between the oscillation circuit and the component and a plurality of flip flops for dividing the at least the portion of the output to identify at least one frequency for operation. The apparatuses, systems, and methods further include a second buffering circuit to second buffer the at least one frequency to maintain harmonic content of the at least one frequency of the desired frequency.

BRIEF DESCRIPTION OF THE DRAWINGS

The foregoing and other objects, features, and advantages of the present disclosure set forth herein will be apparent from the following description of particular embodiments of those inventive concepts, as illustrated in the accompanying drawings. Also, in the drawings the like reference characters refer to the same parts throughout the different views. The drawings depict only typical embodiments of the present disclosure and, therefore, are not to be considered limiting in scope.

DETAILED DESCRIPTION

Aspects of the present disclosure involve low-jitter, high-frequency crystal oscillators configured to produce signals in various audio electronic devices at various high frequencies, without reducing the quality of the output. Stated differently, the high-frequency crystal oscillators are capable of consistent low jitter and low phase noise over a long period of time, thereby maintaining the integrity of the audio signals. In some embodiments, the high-frequency crystal oscillators may be included or otherwise implemented within an independent electronic circuit, such as in the form of an oscillation circuit executing in a larger circuitry environment of an audio electronic device, or elsewhere.

Other aspects of the present disclosure involve a digital audio clocking device or other type of audio electronic device/apparatus that converts analog audio signals to digital signals and/or digital audio signals to analog signals. In some embodiments, the digital audio clocking device may include one or more of the high-frequency crystal oscillators and/or one or more independent oscillation circuits that include a high-frequency crystal oscillator. The digital audio clocking device may further include various other circuit components, such as buffers, comparators, transformers, flip-flops, multiplexers, resistors, etc., all of which may be used to maintain the integrity of low-noise and low-jitter output generated by the high-frequency crystal oscillators/oscillation circuits, as the output propagates through the circuitry of the digital audio clocking device. Thus, the high-frequency crystal oscillators, in conjunction with other circuit components of the digital audio clocking device, dramatically reduce unwanted switching harmonics and/or distortion that are commonly found in audio signals when converted from analog to digital and/or digital to analog.

In one particular embodiment, the various portions of a design of an audio clocking device may be represented as individual stages. Generally speaking stages represent the different parts of a complete design of an audio clocking device that serve individual, seemingly unrelated purposes, but are related within the context of the full design. For example, a crystal oscillator may generate the initial signal that proceeds to a buffering stage. The crystal oscillator stage and the buffer stage each serve a unique purpose within the overall design of the audio clocking device, and thus, are considered to be independent stages. The low noise and low jitter is maintained as the signal passes through the individual stages of the circuit (i.e., the oscillators are one stage, while the buffer that follows is another stage) by filtering unwanted noise so as to not transfer the noise from one stage to the next.

Figure 1:
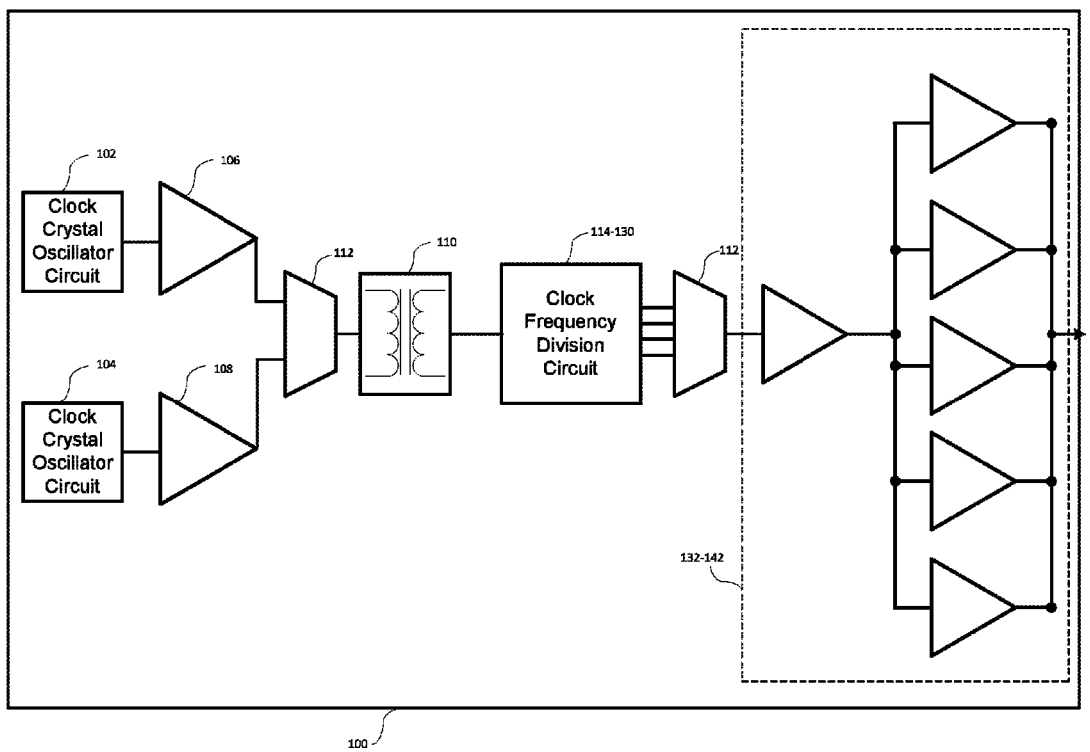
FIG. 1 is a block diagram of a digital audio clocking device, according to aspects of the present disclosure.

FIG. 1 provides an example schematic of a digital audio clocking device 100 that may be used as part of a process for converting analog audio signals to digital and/or digital signals to analog, according to one embodiment of the present disclosure. While the illustrated embodiment involves an independent digital audio clocking device, it is contemplated that the clocking technologies described herein may be implemented or otherwise included in any device that converts analog signals to digital signals, or vice versa. For example, it is contemplated that the clocking technology described herein may be included in or otherwise implemented in audio signal conversion devices, such as audio interfaces, digital mixers, CD players, digital effects, word clocks, word clock generators, and/or the like.

Figure 2:
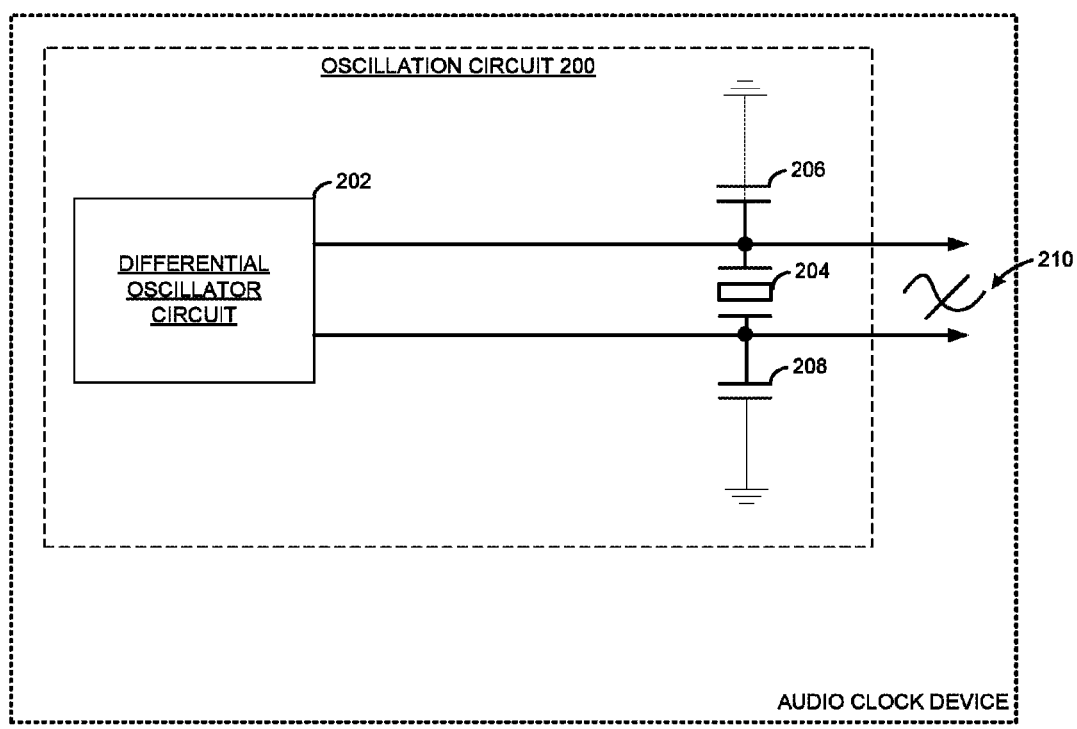
FIG. 2 is a block diagram illustrating an oscillation circuit(s), according to aspects of the present disclosure.

Referring specifically to FIG. 1, the digital audio clocking device 100 includes one or more clock crystal oscillation circuits 102 and 104, either of which may be an oscillation circuit of any suitable type that is capable of propagating signals throughout the digital audio clocking device 100 at consistent low jitter and low phase noise over a long period of time. FIG. 2 provides one example of oscillation circuit 200 (e.g., clock crystal oscillation circuits 102 or 104) that may be used to implement various aspects of the present disclosure. It should be noted that the oscillation circuit 200 of FIG. 2, is only an example, and it is contemplated that other crystal oscillators and/or oscillation circuits of any type may be used. Additionally, it is contemplated that an oscillator that uses a crystal with several supporting devices may be used, monolithic oscillators may be used, oscillators with low noise, and low timing jitter that do not include phased-locked loops ("PLL"), as well as or any other "clean up" devices may be used.

In the illustrated embodiment, the oscillation circuit 200 includes a differential oscillator circuit 202 (also referred to as a oscillator driver circuit or oscillation circuit), a resonating crystal 204, and a pair of load capacitors 206 and 208. The resonating crystal 204 may be formed from a variety of resonating crystalline materials (e.g., quartz and tourmaline), such as for example, a piece of quartz that is precisely cut, sized, and shaped to resonate at a particular frequency. In one embodiment, the frequency of crystal included within the oscillation circuit(s) 102 and/or 104 may be set at a specific multiple of the goal frequency output by the digital audio clocking device 100 of FIG. 1. The resonating crystal 204 is coupled between differential terminals of the differential oscillator circuit 202 and may be mounted off-chip from the differential oscillator circuit 202. Each of the load capacitors 206 and 208 may be coupled between ground potential and one of the two symmetrical and differential output terminals of the resonating crystal 204 to shunt the output terminals of the resonating crystal 204 to ground.

The differential oscillator circuit 202 drives the resonating crystal 204 to oscillate at a particular frequency in order to define a sinusoidal and differential output signal 210 across the two symmetrical output terminals of the crystal 204. The sinusoidal and differential output signal 210 may be used in various audio applications, such as phase locked loops, frequency tunable digital filters, digital synthesizers, among others, and/or may be used to drive various digital audio devices. However, phase noise may still be present in the output signal due to, for example, noise and/or jitter caused by the oscillator driver circuit 202. In order to further reduce the noise and jitter (e.g., phase noise) in the resulting output signal 210 and maintain current reductions in the noise and jitter (i.e., protect the clock signal from parasitic elements that cause additional noise and jitter beyond what is already present in the signal), the environment and circuitry surrounding the oscillation circuit 200 is controlled, as the output signal 210 propagates through the digital audio clocking device 100 depicted in FIG. 1.

Figure 3:
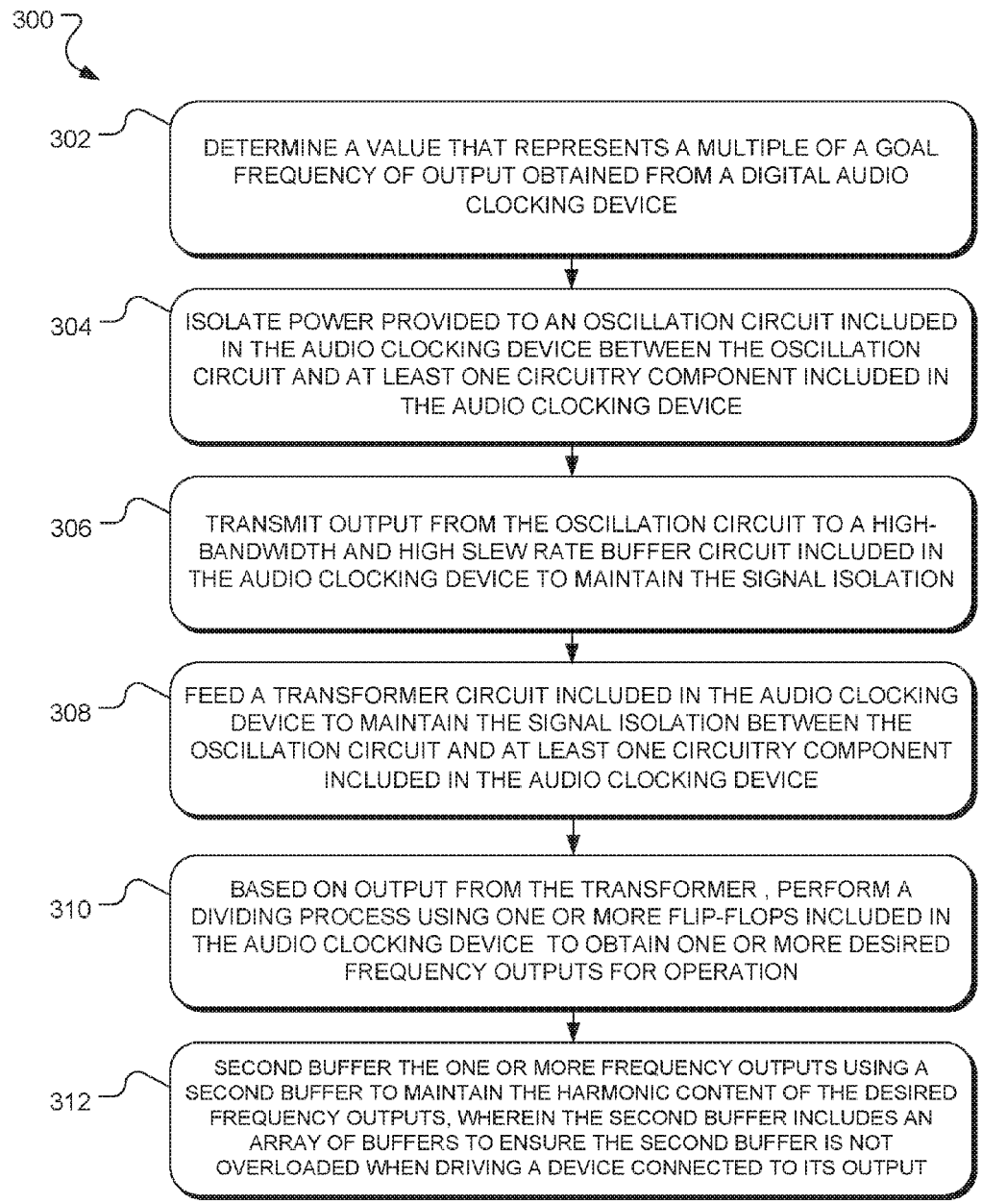
FIG. 3 is a flowchart illustrating an example process for generating and maintaining high-quality digital audio signals, according to aspects of the present disclosure.

An illustrative process for maintaining low noise and low jitter in audio signals, particularly for audio signals being converted from analog to digital and/or digital to analog, is depicted in FIG. 3 and will be explained with reference to FIG. 1. In particular, FIG. 3 illustrates an example process 300 for maintaining low noise and jitter in digital audio signals based on output from high-frequency crystal oscillators. As noted above, FIG. 1 represents an example of a digital audio clocking device 100 that includes one or more of the high-frequency crystal oscillators and various other components that may be used to perform or otherwise execute the process 300.

As illustrated in FIG. 3, process 300 begins with determining a value that represents a multiple of a goal frequency of output obtained from a digital audio clocking device (operation 302). Referring to FIG. 1, a frequency output of the digital audio clocking device 100 is determined. For example, assume the frequency output of the digital audio clocking device 100 is 48 kHz, a standard word clock rate. Then the multiple may be an even number multiple of that frequency divisible by two. For example, 24.576 MHz is a possible value as when divided by 512, an even, whole value number, resulting in the 48 kHz frequency.

Referring again to FIG. 3, electrical power provided to the oscillation circuits of the digital audio clocking device is isolated from the rest of the circuitry (operation 304). For example and as illustrated in FIG. 1, power provided to the oscillation circuits 102-104 may be isolated from all of the other components included within the digital audio clocking device 100. The power is isolated to reduce the noise transferred through the supply from one stage to the next. Isolating the power reduces parasitic elements from affecting the signal, including stray capacitance and inductance, and thereby maintains the low jitter and low noise of the signal.

In some embodiments, the system may employ several methods of isolating power for the individual stages, both passive and active. Throughout the circuit, various ceramic and film capacitors are used in parallel on the power line to reduce the high frequency crosstalk transmitted between stages through the power line. In addition to these capacitors, electrolytic capacitors are placed near every stage not only to help reduce the crosstalk between stages, but to act as current reservoirs for the specific stages that they are serving. This helps reduce parasitic elements inherent in standard printed circuit boards' power lines by reducing the distance from the effective source of power for each stage. It creates a local source of power or "decouples" the stage from the common power source. In addition to the capacitors, several inductors and ferrite elements are used throughout the circuit in series with the stages. This creates a more effective filter of a higher order and not only protects the individual stages from the noise generated in other stages, but keeps the noise generated within other stages from propagating throughout the rest of the circuit.

In addition to these methods, isolation may also be achieved by using active voltage regulator circuits for grouped stages. This is another method of creating a local power source isolated from the main power source. This provides a high current, low impedance power source free from many of the parasitic elements inherent in standard printed circuit boards' power lines by focusing on small sections of the circuit instead of a common supply for the entire circuit.

In other embodiments, the methodologies described above may reduce many parasitic elements of the printed circuit boards which reduce current availability to the individual stages and cause reduced performance capabilities and noise to be more freely transferred between the individual stages. For example, it is quite common for a crystal oscillator to produce noise that would affect the other stages around it. Often times this occurs via the power supply. To prevent this from happening, there is an electrolytic capacitor acting as a current reservoir a short distance away from the crystal itself. From there, a ferrite bead is in series with the main power line going into the input of a low noise voltage regulator. That input is decoupled with a high quality film or ceramic capacitor. The output of the regulator is also decoupled with a high quality film or ceramic capacitor as well as an electrolytic capacitor to maintain the current available to the crystal, thus reducing the output impedance seen by crystal oscillator. As with the input of the regulator, the crystal also has a ferrite bead in series with the regulator's output. Most of these methods are employed very close to the actual stages, often times within an inch or less of distance.

Referring again to FIG. 3, the oscillation circuits generate output that is passed to an initial buffer to maintain low jitter and noise and maintain the harmonic content of the output (i.e., at no point is the output stressed) (operation 306). For example, referring to FIG. 1, any output received from the oscillation circuits 102-104 is passed to an initial buffer, such as a high-bandwidth and/or high slew rate buffer circuit. In one embodiment, the buffer circuit may be equivalent to one or more comparator circuits 106-108, either of which compares analog signals to produce a one bit digital signal. Providing the output from the oscillation circuits 102-104 to the comparators 106-108 reduces any parasitic elements, such as stray capacitance and inductance. Moreover, since the buffer is generally a high bandwidth and high slew rate circuit, the harmonic content of the signal remains intact and jitter variations caused by pulse slewing are reduced.

Generally speaking, slew rate is the amount of time it takes an active device to change its output voltage, and is expressed in volts per second. An ideal slew rate would entail an instantaneous change in voltage (e.g., 0 to 5 volts). A slower slew rate causes distortion in the sampled signal during conversion of the signal from audio (analog) to digital and/or digital to audio (analog), which then causes unwanted and unrelated harmonics and switching delays. When referenced to other synced clocks, this might be seen as "lag." Slow slew rates make signals more susceptible to jitter from electrical noise inherent in all electronics. It causes random variations in the digital switching time when the noise mixes with the digital signal. Slew rate affects bandwidth as well; thus, employing a high bandwidth signal path ensures there is no roll off of the spectral content of the current clock signal. Maintaining high slew rate also helps reduce the effects of random jitter caused by electrical noise in the signal path that is inherent in all electrical signals. Finally, employing a high-bandwidth signal path ensures that the timing of the crystals in the oscillation circuits 102-104 can be accurately recreated.

Referring again to FIG. 3, the buffer is used to feed a transformer circuit, (in the case of multiple oscillation circuits via multiplexer 112) that, along with the initial buffer, maintains low jitter variations and maintains the isolation between the oscillation circuits 102-104 and the rest of the circuitry included in the digital audio clocking device 100 (operation 308). For example, referring to FIG. 1, the comparators 106-108 feed a transformer 110 that generates additional harmonics in the signal that are generally considered to be audibly pleasing.

In some embodiments, the circuitry within the digital audio clocking device (e.g., the digital audio clocking device 100) may perform one or more dividing stages (i.e., signal dividers) on the output of the transformer to obtain the necessary multiples for operation (operation 310). Generally speaking, "operation" refers to the actual purpose of the signal output from the device. Since this is a word clock generating device, it may generate a signal that is a constant digital clock within the frequency range of 44.1 kHz to 384 kHz that is used to synchronize several digital devices together. As with the initial buffer, the dividing circuits must be of high slew rate and high bandwidth in order to preserve the harmonic content and low jitter. During the dividing process, all the frequencies created are treated the same way. More specifically, if one is processed or filtered in any way, those processes or filters must be compatible with the other frequencies so that they all maintain a similar harmonic image.

Referring to FIG. 1 and in one embodiment, the dividing may be performed by a series of flip-flops 114-130. In one embodiment, each flip flop divides by two (2). Thus, the circuits have 2 flip flops each. The flip flops must divide by 2 as much as ten times depending on the desired output frequency. The flip flops maintain the harmonic content of the incoming signal. As explained above, if a system's out frequency goal is 48 kHz, the system may generate a multiple of that frequency, for example 24.576 MHz. Each flip flop stage divides by two. Accordingly, if the signal goes through nine flip flop stages, it divides by two nine times. The 24.576 MHz signal having been divided by two, nine times (totaling a division by 512) would be 48 kHz. In some embodiments, the number of times the signal gets divided by two depends on the goal frequency. For example, if the goal was instead 192 KHz, then the 24.576 MHz signal would only pass through seven flips flops to be divided by two, seven times. This would be a total division by 128.

The output (e.g., the frequency outputs, or when a multiplexer 112 is used for a single output) is buffered again using one or more high-bandwidth and high-slew rate buffers to maintain harmonic content of the harmonic frequency outputs (operation 312). For example, referring to FIG. 1, one or more buffers 132-142 may be used to buffer the output received from the dividing stages performed by the flip-flops 114-130. In one embodiment, each buffer 132-142 includes or otherwise is associated with a set and/or series of buffers (e.g., an array of 5 buffers) that may be used to buffer the output. Thus, each output is buffered with a set of buffers fed from the same signal and applied to the same output, thereby creating a redundant current source to drive output. In such an embodiment, the buffers may only drive a 75 Ohm load or lower and each respective buffer must be able to supply several multiples of the minimum current required to drive such a load. Since, as a load is increased from even a very light load, certain capabilities are reduced, such as slew rate and bandwidth. With these reductions, parasitic elements inherent in the circuitry of the digital audio device 100 and other factors in the operating environment become more apparent, which causes a reduction of overall performance. Using arrays reduces the amount of load on each individual buffer so that each operates well into an ideal range even under stressful loading. The load is effectively divided among each of the five (5) buffers in the array.

Thus, as explained above, the various digital audio devices and components maintain power isolation between the individual stages in order to reduce the noise transferred through the supply from one stage to the next. Doing so helps reduce electrical noise which causes a randomizing element in jitter. The isolation also reduces jitter caused by different stages affecting each other. When a signal goes through a buffer or other semiconductor, typically there is a propagation delay—a time delay from when the signal enters the semiconductor to when it reaches the output. Since there are several stages, the propagation delay is additive with every stage that it passes. To mitigate against such issues, care is taken so that not all stages are pulsing up or down at the exact same time, one stage's pulse does not transfer through power or ground noise to create an error pulse in another stage. This variation in another stage's pulse timing would manifest itself as jitter in the circuit and would be carried on by every proceeding stage in the unit.

The embodiments of the present disclosure described herein are implemented as logical steps in one or more digital audio clocking device apparatuses and/or systems. The logical operations of the present disclosure are implemented (1) as a sequence of processor-implemented steps executing in one or more of such devices and/or (2) as interconnected machine or circuit engines within one or more computer systems and/or audio computer systems.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the disclosure and are thus within the spirit and scope of the present disclosure. From the above description and drawings, it will be understood by those of ordinary skill in the art that the particular embodiments shown and described are for purposes of illustrations only and are not intended to limit the scope of the present disclosure. References to details of particular embodiments are not intended to limit the scope of the disclosure.

What is claimed is:

1. A digital audio clocking apparatus comprising:
   an oscillation circuit for propagating a low jitter output through other circuitry of the digital audio clocking device, wherein the oscillation circuit comprises at least one high-frequency crystal oscillator to generate the low jitter output; and
   wherein the other circuitry comprises:
      a component to isolate electrical power provided to the oscillation circuit from at least one component included in the other circuitry to protect the low jitter output from at least one parasitic element;
      a first buffering circuit to first buffer a portion of the low jitter output to maintain low jitter of the output and maintain signal isolation;
      a transformer to:
         receive the portion of the low jitter output from the buffering circuit to maintain the signal isolation between the oscillation circuit and the component;
         a plurality of flip flops for dividing the at least the portion of the output to identify at least one frequency for operation; and
         a second buffering circuit to second buffer the at least one frequency to maintain harmonic content of the at least one frequency of the desired frequency.

2. The digital audio clocking apparatus of claim 1, wherein the second buffering circuit includes a plurality of buffers when buffering the at least one frequency to ensure the second buffering circuit is not overloaded when driving a device connected to the output of the second buffering circuit.

3. The digital audio clocking apparatus of claim 1, wherein the at least one parasitic element is at least one of stray capacitance, inductance, and resistance.

4. The digital audio clocking apparatus of claim 1, wherein the buffering circuit is a high bandwidth and high slew rate buffer circuit.

5. The digital audio clocking apparatus of claim 1, wherein the oscillation circuit maintains low jitter of the low jitter output over a period of time.

6. The digital audio clocking apparatus of claim 1, wherein the transformer is further configured to generate additional harmonics in the portion of the output and provide galvanic isolation.

7. A digital audio clocking system comprising:
   a digital audio clocking device comprising:
      an oscillation circuit for propagating a low jitter output through other circuitry of the digital audio clocking device, wherein the oscillation circuit comprises at least one high-frequency crystal oscillator to generate the low jitter output; and
      wherein the other circuitry comprises:
         a component to isolate electrical power provided to the oscillation circuit from at least one component included in the other circuitry to protect the low jitter output from at least one parasitic element;
         a first buffering circuit to first buffer a portion of the low jitter output to maintain low jitter of the output and maintain signal isolation;
         a transformer to:
            receive the portion of the low jitter output from the buffering circuit to maintain the signal isolation between the oscillation circuit and the component;
            a plurality of flip flops for dividing the at least the portion of the output to identify at least one frequency for operation; and
            a second buffering circuit to second buffer the at least one frequency to maintain harmonic content of the at least one frequency of the desired frequency.

8. The digital audio clocking system of claim 7, wherein the second buffering circuit includes a plurality of buffers when buffering the at least one frequency to ensure the second buffering circuit is not overloaded when driving a device connected to the output of the second buffering circuit.

9. The digital audio clocking system of claim 7, wherein the at least one parasitic element is at least one of stray capacitance, inductance, and resistance.

10. The digital audio clocking system of claim 7, wherein the buffering circuit is a high bandwidth and high slew rate buffer circuit.

11. The digital audio clocking system of claim 7, wherein the oscillation circuit maintains low jitter of the low jitter output over a period of time.

12. The digital audio clocking system of claim 7, wherein the transformer is further configured to generate additional harmonics in the portion of the output and provide galvanic isolation.

* * * * *